United States Patent
Molloy et al.

(10) Patent No.: US 6,656,850 B2
(45) Date of Patent: Dec. 2, 2003

(54) METHOD FOR IN-SITU REMOVAL OF SIDE WALLS IN MOM CAPACITOR FORMATION

(75) Inventors: Simon J. Molloy, Orlando, FL (US); Nace Layadi, Orlando, FL (US); Edward Belden Harris, Orlando, FL (US); Sidhartha Sen, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/215,170

(22) Filed: Aug. 8, 2002

(65) Prior Publication Data

US 2002/0192897 A1 Dec. 19, 2002

Related U.S. Application Data

(62) Division of application No. 09/466,715, filed on Dec. 17, 1999, now Pat. No. 6,458,648.

(51) Int. Cl.[7] .............................................. H01L 21/362
(52) U.S. Cl. ....................... 438/733; 438/726; 438/734; 438/739
(58) Field of Search .............................. 438/705, 706, 438/707–714, 723, 724, 726–733, 734, 739; 216/37, 39, 63, 64, 67–71, 80, 74–75

(56) References Cited

U.S. PATENT DOCUMENTS

| 4,450,048 | A |   | 5/1984  | Gaulier  ....................... 204/15 |
|-----------|---|---|---------|----------------------------------------|
| 5,479,316 | A |   | 12/1995 | Smrtic et al.  ................ 361/322 |
| 5,514,247 | A | * | 5/1996  | Shan et al.  .................. 438/700 |
| 5,708,559 | A |   | 1/1998  | Brabazon et al.  ............ 361/313  |
| 5,843,827 | A |   | 12/1998 | Gregor et al.  .............. 438/301  |
| 5,865,900 | A | * | 2/1999  | Lee et al.  ..................... 134/1.2 |
| 5,872,062 | A | * | 2/1999  | Hsu  ........................... 438/720 |
| 5,939,750 | A |   | 8/1999  | Early  .......................... 257/321 |

* cited by examiner

Primary Examiner—Carl Whitehead, Jr.
Assistant Examiner—Thanhha Pham

(57) ABSTRACT

A method for fabricating an MOM capacitor (10) includes forming a first conductive layer (18) on an insulating support (12, 14), depositing a dielectric film (20) on the conductive layer, and patterning the dielectric film to define the capacitor feature. The dielectric film may comprise a stack of oxide and nitride layers (22, 24, 26). The dielectric is etched anisotropically with a fluorocarbon plasma to remove unwanted dielectric material (38) around the capacitor feature. Sidewalls (40), built up during the anisotropic etch as a result of sputtering the first conductive layer during the necessary overetch, are removed in a low power, higher pressure etch with an $SF_6$ plasma, which is substantially isotropic in character. The process allows a sidewall-free capacitor to be formed in a single reactor without the need for solvent cleaning to remove the sidewall material.

8 Claims, 2 Drawing Sheets

METHOD FOR IN-SITU REMOVAL OF SIDE WALLS IN MOM CAPACITOR FORMATION

This application is a divisional of application Ser. No. 09/466,715, filed Dec. 17, 1999 now U.S. Pat. No. 6,458,648 entitled METHOD FOR IN-SITU REMOVAL OF SIDE WALLS IN MOM CAPACITOR FORMATION.

FIELD OF THE INVENTION

This invention relates to the device fabrication arts. It finds particular application in the removal of titanium-containing sidewalls which develop during formation of metal-oxide-metal capacitors, and will be described with particular reference thereto.

BACKGROUND OF THE INVENTION

Capacitors are widely used in integrated circuits. Metal-oxide-metal (MOM) capacitors are formed on an insulative support, such as a silicon wafer, with a field oxide, such as silicon dioxide, coating one surface. A conductive layer, such as a layer of titanium nitride or other conductive material, is deposited on the insulated support to form a first conductive electrode. A dielectric film is then deposited on the electrode material. The dielectric material may comprise a layer of silicon dioxide, or other dielectric material, or a stack of several layers of different dielectric materials, such as silicon dioxide and silicon nitride. The dielectric film is patterned with a photoresist material to define the capacitor feature. The unwanted silicon dioxide around the capacitor is then etched to expose the titanium nitride electrode beneath. Finally, the photoresist material is stripped from the dielectric material and a second layer of conductive material, such as aluminum, is deposited on the upper surface of the dielectric film to define a second electrode.

The etching process for removal of unwanted dielectric material is typically carried out in a plasma etching tool, such as a reactive ion etch (RIE) reactor. An anisotropic etch is often used to define the shape of the capacitor feature. During the etching process, however, titanium-containing sidewalls develop at the edges of the capacitor feature. These sidewalls form as a result of sputtering of the titanium nitride layer during the necessary over-etch. Unless removed, the titanium-containing sidewalls can short the electrodes of plates of the capacitor. Additionally, if not removed, the sidewalls have been found to cause corrosion of the aluminum top layer of the capacitor, leading to degradation of the capacitor functions and can reduce yields.

The sidewalls are not easily removed during conventional solvent cleaning processes. Additionally, solvents used to remove the sidewalls often have high levels of mobile ion contaminants (i.e., $Na^+$, $K^+$). If the contaminants become absorbed by the device, they may travel through the various layers and cause electrical device defects and degradation in the overall performance and yield of the device. Wet chemicals, such as BOE (buffered oxide etch, a mixture of $NH_4F$ and HF in solution) mixed with ethylene glycol or NE14 (a mixture of dimethylacetamide, $NH_4F$, and water), that contain fluorine, will etch the capacitor dielectric, and therefore are unsuitable for removing the sidewalls.

An alternative method of removing the unwanted dielectric material is to pattern the dielectric in an isotropic plasma etch. The isotropic etch process does not result in excessive sidewalls. This approach can produce a well defined capacitor dielectric if the dielectric material is a single material, such as silicon dioxide. However, the technique is not readily suitable for use when the dielectric is a stack of different dielectric materials, such as silicon dioxide and silicon nitride layers, commonly referred to as an oxide-nitride-oxide (ONO) stack. The silicon nitride layers in the stack etch away much faster than the silicon dioxide layers in this type of etching process, and notching or undercutting of the nitride layers can result. This, in turn, can result in shorting of the capacitor plates.

Additionally, the isotropic etching techniques that use ceramic plasma tubes have severe particle problems when used for the long process times needed to pattern silicon dioxide and similar dielectric materials.

What is needed, therefore, is method of patterning a dielectric layer which overcomes the above-referenced problems, and others.

SUMMARY OF THE INVENTION

In accordance with one aspect of the present invention, a method of fabricating an integrated circuit metal-oxide-metal capacitor is provided. The method includes forming a first electrically-conductive layer on an electrically insulating support and depositing a dielectric film on the first conductive layer. A portion of the dielectric film is then etched. The method further includes etching sidewalls from a remaining portion of the dielectric film. The sidewalls are formed during etching of the dielectric due to over-etching of the first conductive layer.

In accordance with another aspect of the present invention, a method for etching a patterned dielectric film comprises depositing a dielectric film on an electrically-conductive layer and patterning the dielectric film with a mask material. Unmasked regions of the dielectric film are anisotropically etched with a first plasma in a plasma reactor. Sidewalls are etched in the plasma reactor with a second plasma which is substantially isotropic in character. The sidewalls are formed on masked regions of the dielectric film during the anisotropic etching step, and comprise material sputtered from the electrically conductive layer.

BRIEF DESCRIPTION OF THE DRAWINGS

The invention is best understood from the following detailed description when read with the accompanying drawing FIGURES. It is emphasized that various features are not necessarily drawn to scale.

DETAILED DESCRIPTION OF THE INVENTION

Figure 1:
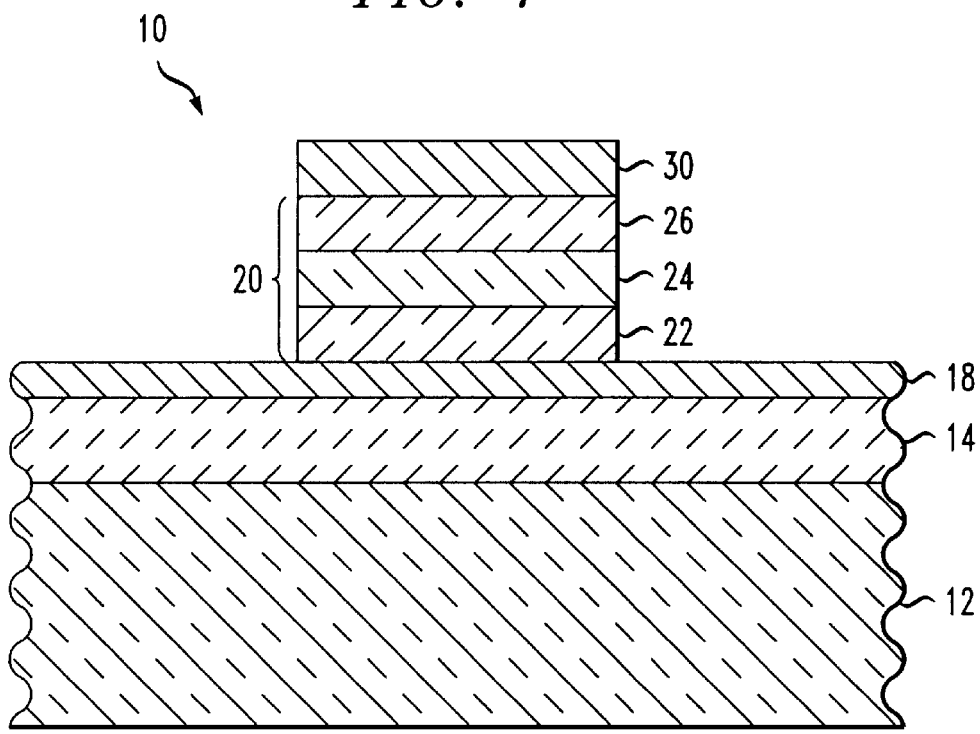
FIG. 1 is a side sectional view of an MOM capacitor in accordance with the present invention.

With reference to FIG. 1, a metal-oxide-metal (MOM) capacitor 10 is formed on a substrate 12, which may be silicon, gallium arsenide, SiGe, or other suitable material for integrated circuit fabrication. Preferably, an insulating layer 14, such as a layer of field oxide, for example, silicon dioxide, covers a surface of the substrate 12.

A first electrically-conductive electrode 18 is established on the substrate 12 or on the field oxide 14 carried by the substrate. The first conductive electrode 18 may be a layer of metal, such as a refractory metal. Illustrative materials for forming the conductive electrode 18 include but are not limited to titanium, tungsten, or an alloy of titanium and tungsten, chromium, and/or hafnium. The first conductive electrode may also be formed of an intermetallic compound, that is, a compound which is a combination of a metal and a non-metal that has properties of both, such as titanium nitride. For ease of reference, the first conductive electrode will be described as comprising a titanium nitride layer, although it is to be appreciated that other materials may be used in this capacity.

A film of dielectric material 20, such as a layer of silicon dioxide, tantalum pentoxide, silicon nitride, barium titanate, or other similar elements or combination thereof, is disposed on the first conductive electrode in a layer as thin as about 400–1,000 Å, or less, to provide the dielectric layer of the capacitor.

The electrical properties most important for the dielectric material are the dielectric constant, leakage current at operating bias and temperature, and the breakdown field. The dielectric constant of the material determines the capacitance density which increases with increase in dielectric constant. For MOM applications, it is desirable to have a dielectric with optimum dielectric constant which at the same time exhibits very low leakage current per unit area under stress conditions and high breakdown fields. Preferably, for a 400 Å dielectric film thickness, the leakage current density of MOM is better than 50 nA/cm$^2$ at a bias of 5V. The breakdown field of the dielectric is preferably better than 7 MV/cm. It is equally important for the MOM dielectric to meet the reliability criteria set forth by a given technology, typically a failure rate of 1 FIT under operating conditions.

In one embodiment, the dielectric film 20 comprises a stack of two or more layers of dielectric material, such as sequential layers of silicon dioxide and silicon nitride. FIG. 1, by way of example, shows the dielectric material comprising a first, lower layer 22 of silicon dioxide, disposed on the first conducting electrode 18, a second, intermediate layer of silicon nitride 24, and a third, upper layer of silicon dioxide 26. It will be appreciated that the dielectric material may contain fewer or more such layers in a variety of combinations, depending on the desired dielectric constant of the overall dielectric material 20.

A second electrically-conductive electrode 30, such as a layer of aluminum, is disposed on the dielectric layer 20 to complete the capacitor. The second conductive electrode may be formed as part of the first level of metallization interconnect layer of the integrated circuit or separately formed. The second conductive electrode may be made of a variety of conductive materials, such as aluminum, aluminum alloys, silicon, copper, gold, or alloys of the above, and may include an adhesion layer (not shown), such as a layer of titanium or titanium tungsten, or a diffusion barrier (not shown), such as a layer of platinum, or both an adhesion layer and a diffusion barrier.

To form the metal-oxide-metal capacitor 10 of the present invention, the layer for the first conductive electrode 18 is deposited onto the field oxide support 14 by known techniques, such as by sputtering, vacuum evaporation, or chemical vapor deposition (CVD). If desired, the conductive layer may be patterned at this stage or later in the fabrication process.

Figure 2:
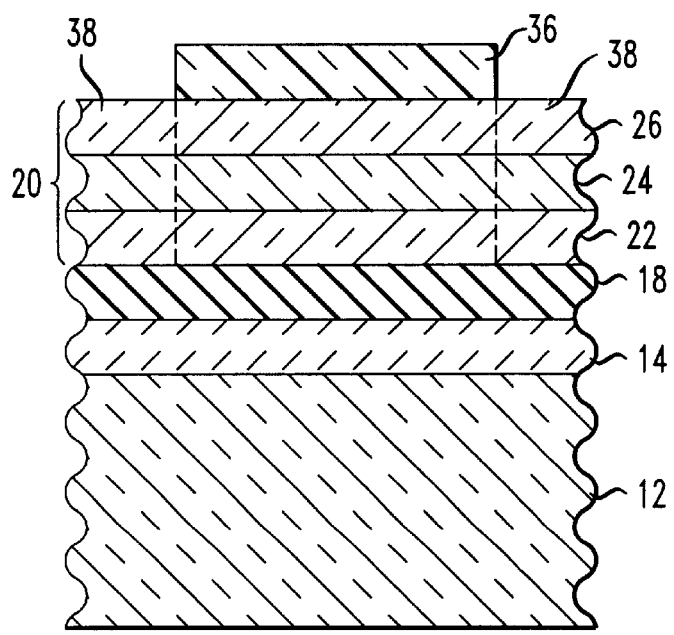
FIG. 2 is a side sectional view of a wafer following deposition of a first conductive layer, a dielectric film, and a layer of photoresist material.

With reference also to FIG. 2, the dielectric film 20 is then deposited on the first conductive electrode, by known techniques. Suitable methods for depositing the dielectric film include sputtering, vacuum evaporation, and CVD of either the low pressure or the plasma type.

As shown in FIG. 2, a stack of dielectric layers 22, 24, 26 has been deposited on the first electrode layer 18 by depositing first an oxide layer (silicon dioxide), then a nitride layer (silicon nitride), and finally a second oxide layer. The dielectric material can contain a number of oxide and nitride layers which are deposited one on top of the other to form a stack. Other arrangements of oxide/nitride layers are also contemplated.

The upper surface of the dielectric layer 20 is then patterned with a masking material, such as a layer of photoresist material 36 to define the dimensions of the capacitor 10.

Figure 3:
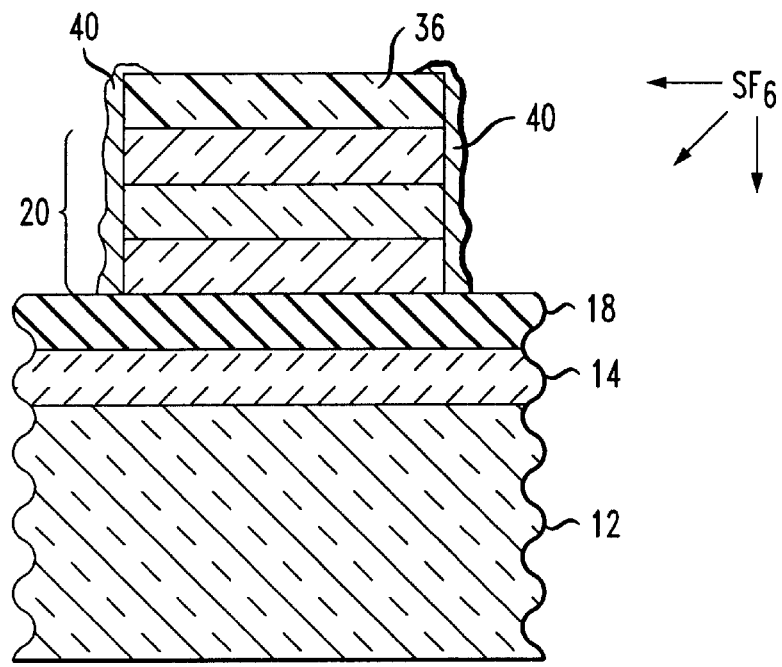
FIG. 3 is a side sectional view of the wafer of FIG. 2 after removal of unwanted dielectric material and development of sidewalls.
Figure 4:
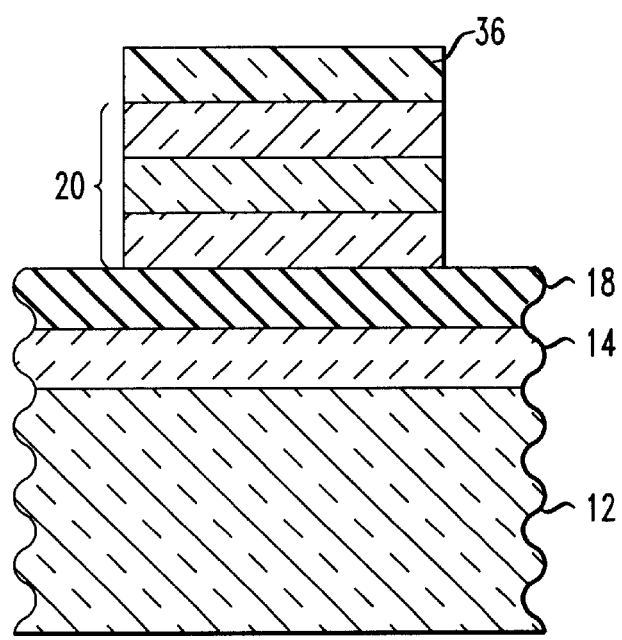
FIG. 4 is a side sectional view of the wafer of FIG. 3 after etching the sidewalls.

With continued reference to FIG. 2, and reference also to FIGS. 3 and 4, an exemplary two-step etching process is then carried out to remove unwanted dielectric material 38 around the capacitor feature and leave the sides of the dielectric film clean. In a first step, the dielectric layer 20 is etched down to the first conductive electrode layer 18, leaving the areas of the dielectric material which were patterned with the photoresist exposed above the first conductive layer (FIG. 3). In the second step, sidewalls 40 formed during the etching process are removed (FIG. 4). Both of these processes may be carried out in a single reactor, reducing processing time.

An exemplary two-step process employs a reactive ion etching (RIE) tool or reactor for both steps, although other plasma etch tools may also be employed. Other suitable etching tools for carrying out the process include triode etch reactors and high density plasma reactors. Reactive ion etching is sometimes referred to as reactive sputter etching (RSE).

In the first step, the unwanted dielectric 38 around the capacitor feature is removed using an anisotropic etch. This is a directional etch in which the wafer is bombarded with ions under the influence of a field. The anisotropic etch results in removal of all or the bulk of the unwanted dielectric. In the exemplary embodiment a plasma comprising fluorine-containing ions, such as F$^-$ and CF$_2{}^-$ to etch the dielectric is employed. Suitable sources of fluorine-containing ions include fluorocarbons, sold under the trademark FREON. CF$_4$ is a particularly preferred source of fluorine ions. Other suitable sources of fluorine ions are CHF$_3$, CF$_3$Cl, CF$_2$Cl$_2$, C$_2$F$_6$, C$_4$F$_8$, and the like. Nitrogen-fluorine compounds, such as NF$_3$, may also be used. CF$_4$ is particularly preferred, due to its high fluorine to carbon ratio. As the carbon concentration of the source of fluorine ions increases, the concentration of organic materials in the sidewalls formed in the first step increases and the walls are more substantial and more difficult to remove in the second step.

The first step is carried out in the RIE reactor at high power and moderate pressure. For an 8" wafer, an exemplary power range is from about 700 to about 1000 watts, more preferably from about 800–900 W, and most preferably, around 850 W. At around 850 W, the dielectric may be etched effectively, without excessive sputtering of the first conductive layer 18.

A preferred reactor pressure for the first step is from about 30 to about 120 mTorr, the lower limits of the pressure being generally defined by the lower operating limits of the tool used. Tools currently available generally run at 30 mTorr or above. With a larger pump, however lower pressures may be achieved, which may also be utilized with the present invention. A preferred pressure is from about 30–80 mTorr, most preferably, around 40 mTorr. The gas flow rate will depend on the selected pressure, a flow rate of about 20 sccm being appropriate for pressures of around 40 mTorr. At higher pressures, greater flow rates would be appropriate.

A magnetic field is optionally applied to enhance the etch rate. The magnetic field may be up to about 100 Gauss. Preferably, lower fields, around 20 Gauss, are employed to limit plasma damage and particle formation. Additionally, uniformity is improved at lower magnetic field.

The anisotropic character of the etch allows the use of composite dielectric materials, such as ONO stacks, to be etched without significant undercutting or notching of the silicon nitride layer(s) (i.e., the most easily etched dielectric material layers).

It should be appreciated that the operating conditions provided above are for an 8" wafer. For larger wafers, the power required will be scaled up, as is known in the art. The power used is a primary factor in the etch rate of silicon dioxide. For fluorocarbon plasmas, including $CF_4$, $CHF_3$, and $C_2F_6$, there is a linear relationship between the plasma power per unit area of wafer and the silicon dioxide etch rate.

The fluorine ion plasma is preferably substantially free of argon, more preferably, free of argon. The addition of argon results in a heavier sidewall since the argon tends to sputter the underlying titanium nitride or other electrode material more than a $CF_4$-only chemistry.

During this first etching step, sidewalls 40 invariably develop. The sidewalls may contain titanium (or other first electrode material) and other substances, such as organic materials, carbon, fluorine, oxides, silicon nitride, and the like. The sidewalls 40 extend upward from the surface of the titanium nitride layer 18, adjacent the four sides of the dielectric material 20 and may overlap the photoresist material 36 as shown in FIG. 3.

The first etching step is continued until the unwanted dielectric material is completely, or substantially removed, and then quickly stopped, to prevent excess build up of the sidewalls. Even a ten second delay in ending the first step can result in excess build up of sidewalls, which are then difficult, if not impossible, to remove in the second step. Thus, an accurate method of detecting the endpoint (i.e., when the unwanted dielectric 38 has been removed) is desirable. Suitable methods for detecting the end point include the use of a standard Plasma Emission End Point system. Such systems detect the change in color of the plasma due to the presence or absence of carbon monoxide. When the unwanted silicon dioxide layer of the dielectric material has been fully stripped, there is a sudden color change as carbon monoxide, formed by reaction of the silicon dioxide with carbon from the fluorocarbon, is no longer present in the plasma. The Plasma Emission End Point system detects this color change and directs the RIE tool to end the first step and commence the second step.

The first step is preferably stopped very quickly after the detection of the end point, to minimize the build up of sidewalls which must be removed in the second step. Once the end point is detected, the reactor is quickly switched to the second step. This involves switching off the supply of FREON, or other plasma source material for the first step, switching on the supply of a source of plasma for the second step, and adjusting the power and pressure levels. In the second step, a plasma comprising a reactive species which etches the sidewalls 40, such as sulfur hexafluoride ($SF_6$), is used at low power and high pressure, to remove the sidewalls 40, as shown in FIG. 3. The plasma preferably includes a noble gas carrier, such as argon or helium, argon being preferred.

The power is preferably in the range of from about 150–450 watts, more preferably, from about 200–400 W, and most preferably, around 300 W. The pressure is preferably in the range of from about 150–300 mTorr, more preferably, from 150–250 mTorr, and most preferably, about 200 mTorr. Suitable gas flow rates are about 20–30 sccm $SF_6$, more preferably about 22 sccm of $SF_6$, and about 60 sccm of argon. The flow rate may be increased, preferably maintaining the same argon to $SF_6$ ratio (roughly 3:1). The minimum flow rate is dependant on the RIE tool employed. With newer, more powerful pumps, flow rates below 20 sccm $SF_6$ may be achieved and utilized with the present invention. A low electric field is preferably used, as for the first step (preferably, around 20 Gauss).

The low power and high pressure give the etch a significant isotropic character, i.e., the walls are etched by bombarding species from a variety of directions, as shown in FIG. 3, rather than primarily from a direction perpendicular to the substrate surface, as would be the case in an anisotropic etch. The $SF_6$ step etches both the sidewall and any residual, unmasked oxide giving a clean, well defined capacitor dielectric, as shown in FIG. 4, without unduly sputtering additional first electrode material. The $SF_6$ plasma, or other plasma used in the second step, is one which does not cause appreciable undercutting or notching of the silicon nitride layers in the stack of dielectric material, i.e., the plasma etch does not significantly etch the dielectric materials in the stack, or, alternatively, it etches both oxide and nitride layers at the same rate, so that the walls of the capacitor remain relatively straight and perpendicular to the substrate surface.

There is no need to use an additional solvent cleaning step to remove the sidewall material, since the above-described process removes all, or substantially all of the sidewall material. Accordingly, the potential for mobile ion contamination during solvent cleaning is avoided.

The time required for completing the first and second steps will depend on the reactor conditions used and the thickness of the dielectric layer to be removed. For example, with a pressure of 40 mTorr, flow rate of 20 sccm, power of 850 W. and field of 20 Gauss, and a dielectric material thickness of about 450 Å, the first step is completed in about 15–18 seconds. For greater film thickness, the time required will be longer. For example, for a 900 Å dielectric thickness, the first step will be approximately doubled, i.e., the first step may be completed in about 30–36 seconds. The second step is completed in a shorter time. For example, at an $SF_6$ flow rate of 22 sccm, an argon flow rate of 60 sccm, a pressure of 200 mTorr, an electric field of 20 Gauss, and a power of 300 W, the second step (following the first step conditions described above) is completed in 8–12 seconds, typically, about 10 seconds. This period of time may be lengthened somewhat for greater dielectric thicknesses due to greater buildup of sidewalls in the first stage.

The photoresist material 36 is then removed, preferably in a non-oxidizing plasma resist strip, such as a plasma strip employing hydrogen. A suitable plasma is generated from forming gas (a mixture of 96% nitrogen and 4% hydrogen). An oxidizing strip is preferably not used as this tends to oxidize the titanium nitride layer.

The second conductive electrode is then deposited on the dielectric material, to yield the capacitor shown in FIG. 1. Additional layers may be deposited over the capacitor for forming the integrated circuit, as is known in the art.

While the invention has been described with reference to an MOM capacitor, it will be appreciated by these skilled in the art that the invention has application in other areas of semiconductor technology where side wall formation during etching of a patterned layer is a problem.

While not intending to limit the scope of the invention, the following examples give suitable reactor conditions for forming an MOM capacitor which is free of sidewalls.

EXAMPLE

A layer of titanium nitride for the first electrode 18 was deposited on an 8 inch silicon wafer by chemical vapor deposition. A layer of silicon dioxide about 450 Å thick was deposited on the titanium nitride layer for forming the capacitor dielectric 20. The silicon dioxide layer was patterned with photoresist 36 to define the dimensions of the capacitor. The wafer was transferred to an RIE tool and subjected to a $CF_4$ etch. The power used was 850 watts, the pressure 40 mTorr, and the flow rate of $CF_4$ was 20 sccm. The end point was detected at about 15–18 seconds. The reactor was quickly changed to a plasma containing $SF_6$ in argon. The flow rate was 22 sccm $SF_6$ and 60 sccm argon, the pressure was 200 mTorr, and the power 300 watts. The reactor was run for about 10 seconds to remove the sidewalls. A non-oxidizing plasma resist strip was used to remove the photoresist. The non-oxidizing resist strip was carried out using forming gas (a mixture of nitrogen and hydrogen, hydrogen being the active species). Scanning electron micrographs of the dielectric after removal of the photoresist show the edges to be substantially free of sidewalls. Similar micrographs taken using an anisotropic etching process without the second step, isotropic etch, revealed substantial sidewalls overlapping the dielectric.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method for etching a patterned dielectric film comprising:
   depositing a dielectric film on an electrically-conductive layer;
   patterning the dielectric film with a mask material;
   anisotropically etching unmasked regions of the dielectric film with a first plasma; and
   removing sidewalls by etching with a second plasma at a power lower than the first plasma which is substantially isotropic in character, the sidewalls being formed on masked regions of the dielectric film during the anisotropic etching step, and comprising material sputtered from the electrically conductive layer.

2. The method of claim 1, wherein the second plasma includes $SF_6$.

3. The method of claim 1, wherein the first plasma is formed from a source of fluorine ions.

4. The method of claim 3, wherein the source of fluorine ions is selected from the group consisting of fluorocarbons and fluorine compounds of nitrogen.

5. The method of claim 3, wherein the source of fluorine ions is $CF_4$.

6. The method of claim 1, further including:
   depositing a second electrically-conductive layer over the dielectric film.

7. A method of etching a patterned dielectric film comprising:
   depositing a dielectric film comprising an oxide directly on an electrically-conductive layer containing titanium nitride;
   etching a portion of the dielectric film with an anisotropic plasma formed from a source of fluorine ions; and
   removing sidewalls containing titanium nitride from a remaining portion of the dielectric film by plasma etching employing a substantially isotropic etching plasma at a power lower than the anisotropic plasma, the sidewalls being formed during the etching of the dielectric film due to overetching of the electrically conductive layer.

8. The method of claim 7, wherein the step of removing said sidewalls includes etching with $SF_6$.

* * * * *